United States Patent
Stievenard et al.

(10) Patent No.: US 6,661,073 B1
(45) Date of Patent: Dec. 9, 2003

(54) SEMICONDUCTOR INFRARED DETECTOR AND METHOD FOR THE PRODUCTION THEREOF

(75) Inventors: Didier Stievenard, Sailly sur la Lys (FR); Christophe Delerue, Ruminghem (FR); Bernard Legrand, Lille (FR)

(73) Assignee: Centre National de la Recherche Scientifique, Paris Cedex (FR)

( * ) Notice: Subject to any disclaimer, the term of this patent is extended or adjusted under 35 U.S.C. 154(b) by 0 days.

(21) Appl. No.: 09/937,392

(22) PCT Filed: Mar. 22, 2000

(86) PCT No.: PCT/FR00/00726
§ 371 (c)(1),
(2), (4) Date: Apr. 1, 2002

(87) PCT Pub. No.: WO00/59042
PCT Pub. Date: Oct. 5, 2000

(30) Foreign Application Priority Data

Mar. 26, 1999 (FR) .............................................. 99 03835

(51) Int. Cl.⁷ .............................. H01L 31/00; G01J 5/20
(52) U.S. Cl. ...................... 257/466; 257/443; 257/448; 257/451; 250/338.4; 250/339.02; 250/345; 250/370.14
(58) Field of Search .............................. 257/17, 21, 443, 257/448, 451, 466; 250/338.1, 338.4, 339.02, 345, 370.14

(56) References Cited

U.S. PATENT DOCUMENTS

| | | | | |
|---|---|---|---|---|
| 4,978,910 A | * | 12/1990 | Knox et al. | 324/96 |
| 5,081,437 A | * | 1/1992 | Mosser et al. | 338/2 |
| 5,444,267 A | * | 8/1995 | Okada et al. | 257/14 |
| 5,689,087 A | * | 11/1997 | Jack | 136/213 |
| 5,838,870 A | | 11/1998 | Soref | 385/131 |
| 5,972,744 A | * | 10/1999 | Morimoto et al. | 438/197 |
| 6,198,100 B1 | * | 3/2001 | Eden et al. | 250/338.4 |
| 6,198,118 B1 | * | 3/2001 | Holcombe | 257/292 |

FOREIGN PATENT DOCUMENTS

JP 10092716 4/1998

OTHER PUBLICATIONS

MacDonald et al., MSM Photodetector Fabricated on Poly-crstalline Silicon, IEEE, Photonics Technology Letters, vol. 11, No. 1, Jan. 1999, ppl 108–10.*

J.Y.L. Ho et al., "High–Speed and High–Sensitivity Silicon–on–Insulator Metal—Semiconductor–Metal Photodetector with Trench Structure", *Applied Physics letters*, 1996, pp. 16–18.

K. Luo et al., "Nanofabrication of Sensors on Cantilever Probe Tips for Scanning Multiprobe Microscopy", Applied Physics Letters, *U.S. American Institute of Physics*, 1996, pp. 325–327.

K. Matsumoto, STM/AFM Nano–Oxidation Process to Room–Temperature–Operated Single–Electron Transistor and Other Devices, *Proceedings of the IEEE*, vol. 85, No.4 Apr. 1997.

H.J. Kim et al., "Formation of a Nanometer–Scale Structure on Silicon with Scanning Tunneling Microscopy in Air", 1995, pp. 182–187.

J.A. Dagata, "Integration of Scanning Tunneling Microscope Nanolithography and Electronices Device Processing" *Journal of Vacuum Science and Technology* American Institute of Physics, pp. 2105–2113.

* cited by examiner

*Primary Examiner*—George Eckert
(74) *Attorney, Agent, or Firm*—Young & Thompson

(57) ABSTRACT

A semiconductor infrared detector includes in the following order: a semiconductor substrate; a layer of electrically insulating material; and patterns formed in a semiconductor layer. The patterns are formed from at least one island that is connected to bridges which are connected to polarization electrodes. The bridges are lines having an approximately constant width $l_p$ and the islands are zones having a width $l_i$ that is greater than that of the lines.

5 Claims, 2 Drawing Sheets

SEMICONDUCTOR INFRARED DETECTOR AND METHOD FOR THE PRODUCTION THEREOF

BACKGROUND OF THE INVENTION

The invention relates to semiconductor infrared detectors.

Known photodiodes are realised of a semiconductor material in which an impinging photon causes electrons to pass from their ground state in which they are bound, to an excited state, thereby creating an electron-hole pair liable to generate a current.

The concentration of these electron-hole pairs depends on the amount of light received, which enables realisation of a photodetector. The application of a polarisation voltage allows measuring the concentration of the electron-hole pairs.

Currently, such detectors are manufactured by piling up semiconductors of different band gaps, so that the carriers are trapped in the material of smallest band gap. Usually materials based on semiconductors III–V make the most efficient detectors. These detectors therefore require the handling of specific materials, for example alloys based on gallium arsenide and aluminum non-compatible with the silicon technologies that are now widely spread and mastered. These silicon technologies are the basis of approximately 80% of the components of modern electronics.

SUMMARY OF THE INVENTION

The document Applied Physics Letters, Vol. 69, Nr. 1, Jul. 1, 1996, pages 16–18 discloses a MSM-type silicon infrared radiation detector with linear silicon structures on a SOI substrate. The structures are 1.15 μm wide and 6 μm high.

The document Journal of Vacuum Science and Technology A Vol. 10, Nr. 4, July/August 1992, pages 2105–2113 (document D2) describes nano-oxidation of the surface of a silicon layer hydrogenated beforehand, by the tip of a tunnel effect microscope (STM) to form patterns by chemical etching.

The purpose of the invention is therefore the realisation of a semiconductor infrared detector in usual semiconductor technologies, for example the silicon technology.

The goal consists in developing such a photodetector, capable, according to its configuration, to operate over wavelength ranges comprised between 5 and 20 μm.

The purpose of the invention is therefore a semiconductor infrared detector realised with the silicon technology.

Its operation is obtained thanks to the particular geometry of the patterns formed in a layer of silicon. More precisely, its operation is based on the fact that the levels of energy accessible to a particle, more particularly to the electron, are quantified when the space accessible to that particle is confined. The realisation of particular patterns, with nanometric dimensions, makes these levels of quantification variable as a function of the geometric modular in relation to the geometric dimensions and makes them sensitive to the infrared radiation.

According to the invention, this photodetector comprises in that order, a semiconductor substrate, a layer of an electrically insulating material, patterns formed in a layer of semiconductor material. The patterns are formed of at least one island connected to bridges connected themselves with polarisation electrodes. The bridges are lines with width $l_p$ approximately constant, whereas the islands are zones with width $l_i$ larger than that of the lines.

In the preferred embodiments each exhibiting specific advantages:

the detector is such that $l_i$ is greater than or equal to 1.2 $l_p$, the length of the islands L satisfies the relation 2 $l_p \leq L \leq 5\ l_p$, $l_p$ ranges between 1 and 10 nm and the detector comprises a number of lines ranging between 1 and 1000, whereas each line comprises approximately 1 to 100 islands, the patterns formed in the silicon layer are realised by local oxidation of the surface of the silicon layer, then by attacking non-oxidised zones, local oxidation of silicon is realised using the tip of an A.F.M. or of an S.T.M.

The semiconductor material is advantageously silicon.

The invention also relates to a method for producing such an infrared detector.

According to this method, we start from a structure comprising a silicon substrate carrying a layer of an electrically insulating material on which a silicon layer is superimposed. The patterns are realised by nano-oxidation with the tip of an A.F.M. or of a S.T.M.

In preferred embodiments each exhibiting specific advantages:

Nano-oxidation is realised with a tip of an A.F.M., carried by a periodically oscillating cantilever and local oxidation is obtained by establishing a periodical potential difference between the semiconductor and the tip, whereas the said potential difference consists of synchronised pulses with same period as that of the oscillations of the cantilever. Oxidation is controlled by acting on the phase of the pulses with respect to the phase of the oscillations of the cantilever.

Etching is obtained by a wet process, with KOH, for removing the non-oxidised silicon zones.

The oscillation frequency of the cantilever and of the voltage pulses is approximately of 300 kHz, the mean voltage of the pulses is in the order of 2 volts whereas their peak value is in the order of 10 volts.

BRIEF DESCRIPTION OF THE DRAWINGS

The invention will be described more in detail with reference to the drawings on which.

DETAILED DESCRIPTION OF THE PREFERRED EMBODIMENTS

Figure 1:
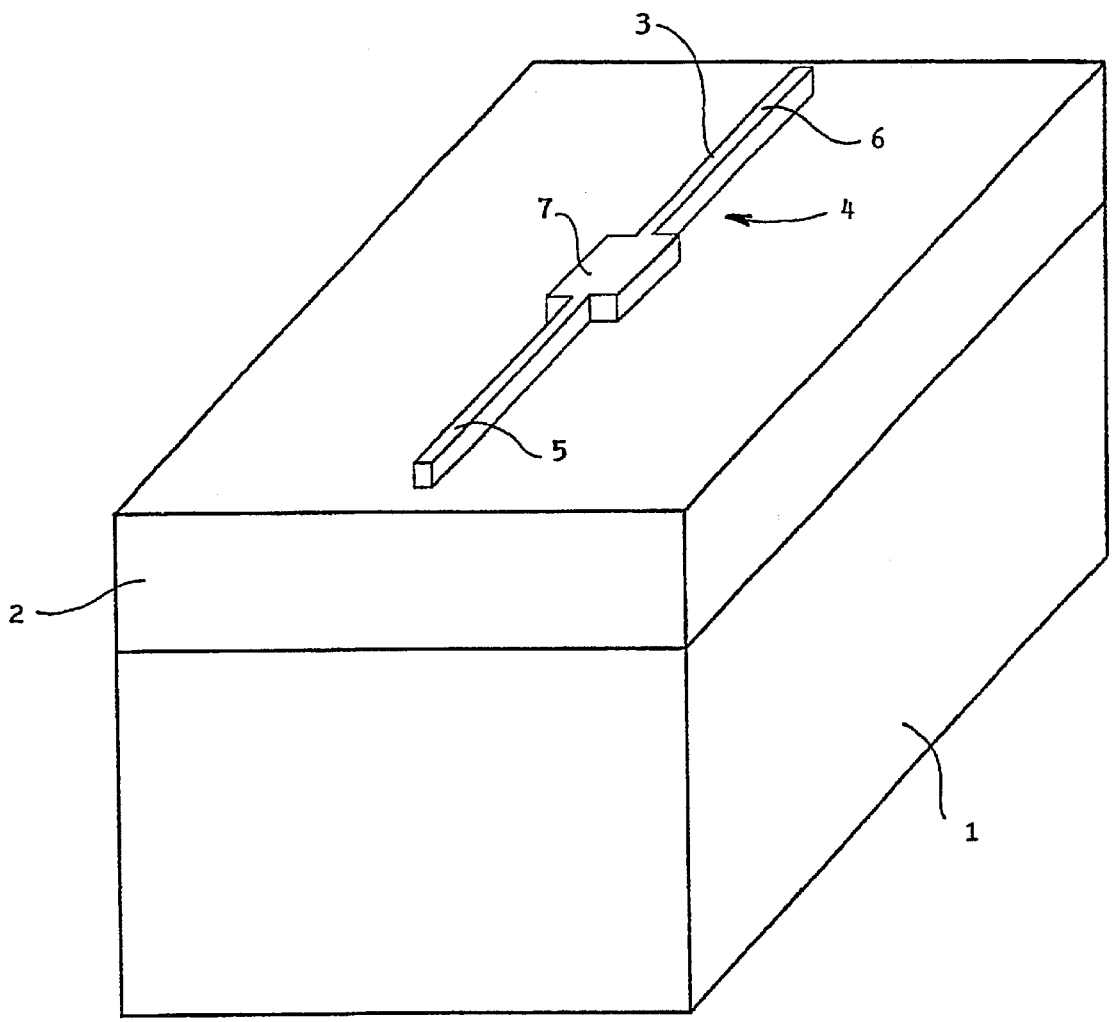
FIG. 1 is a perspective view of a pattern.

The semiconductor infrared detector according to the invention is realised on a silicon substrate 1 whose thickness may be for instance 500 μm on which is formed a continuous, electrically insulating layer 2, for instance made of silicon dioxide with a thickness of approximately 400 nanometers. A third silicon layer 3 initially continuous is formed on this insulating layer.

Patterns 4 essentially made of bridges 5, 6 linked to at least one island 7 are formed in this so-called active silicon layer. The bridges 5 and 6 are each connected to polarisation electrodes, respectively 8 and 9.

Figure 3:
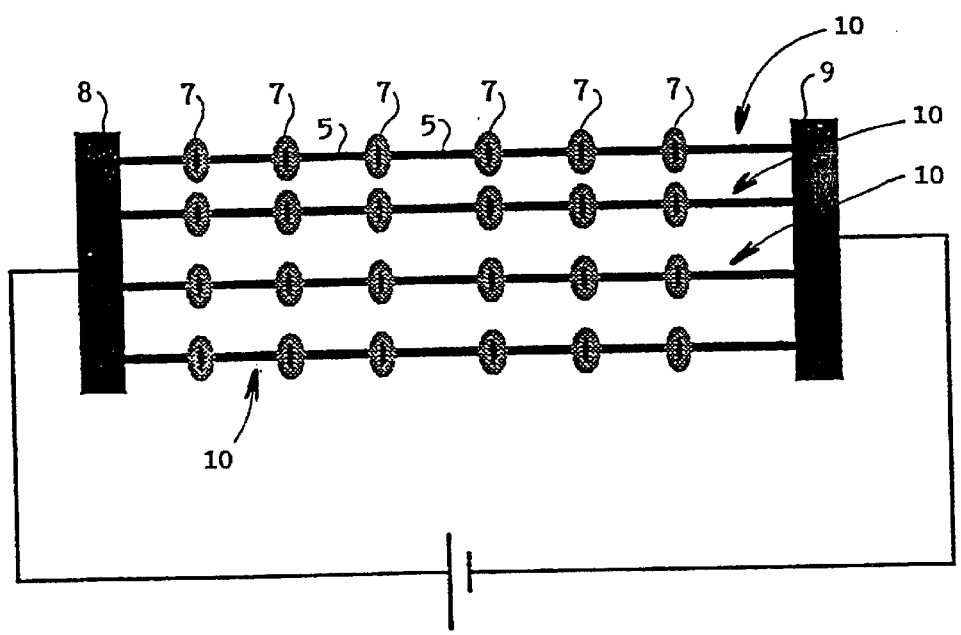
FIG. 3 is a top view of the active silicon zone of a photodetector according to the invention.

These patterns 4 are generally multiplied and associated to one another in lines 10, as represented on FIG. 3.

It has been noticed that when the dimensions of these patterns are nanometric, i.e. in the order of the nanometer, the electrons and the holes are confined, thereby quantifying the energy levels that are accessible to them and making them behave in a fashion comparable to that observed in quantum well detectors.

It is besides possible to modulate these effects in relation to the size of the patterns, i.e. also to the quantum wells. Generally, the detector as represented on FIG. 3 consists of a succession of islands 7 connected together and at their ends to the polarisation electrodes 8, 9 by silicon bridges 5, 6.

The cross section of the silicon bridges is approximately constant, with width $l_p$ of a few nanometers, preferably ranging between 3 and 5 nanometers and they are generally rectilinear. Their length is in the order of 10 to 20 nanometers.

Their thickness is also in the order of a few nanometers, preferably ranging between 5 and 10 nanometers.

The islands 7 are silicon zones wider than the bridges, this width ranges preferably between 5 and 10 nanometers and they extend along the length of the bridge over a comparable distance. Their length L will be preferably such that $l_p \leq L \leq 5 l_p$.

As represented on FIG. 3, a certain number of lines 10 composed of islands 7 connected by bridges 5 and 6 could be placed in parallel, 206 advantageously. Each of these lines is connected to the polarisation electrodes 8 and 9.

The distance between the lines 10 is in the order of 50 to 100 nm and the total distance between the electrodes is in the order of 30 $\mu$m.

Figure 2A:
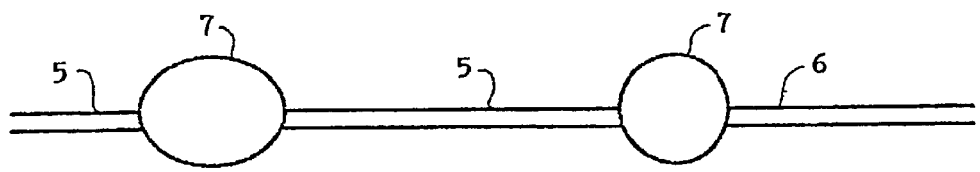
FIG. 2A is a top view representing the active silicon layer.
Figure 2B:
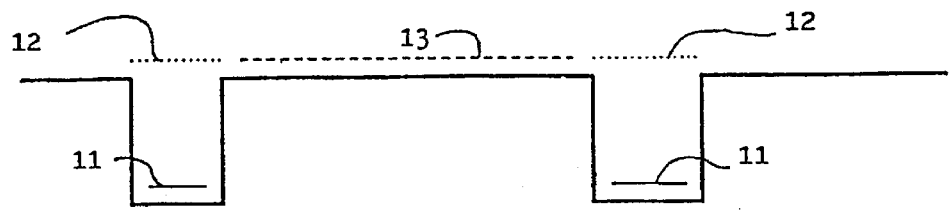
FIG. 2B is a representation of the fundamental levels of the electrons or of the holes with respect to the zones of the active silicon layer where they are localised.

Such a device enables detection of an infrared flux. The explanation of the mechanisms implemented, illustrated on FIG. 2B, seems to be as follows: in a state of equilibrium, the electrons (or respectively the holes) are on the lowest levels 11 of energy in the system that are localised in the islands, where confinement is smallest. Under the effect of an infrared optical excitation, the electrons can transit toward the first excited level 12 of each island. The dimensions of the patterns of the active layer of the detector are such that the excited level is close to the fundamental level 13 of the bridges, so that the excited electron is weakly bound. Under the application of the polarisation voltage established between the electrodes 8 and 9, these electrons weakly bound produce a photocurrent that is measurable and therefore enables measuring the infrared flux.

The realisation of the active layer 3 calls for accurate control of the conditions of the lithography used for etching. To do so, a close field microscope can be used, such as an atomic force microscope (A.F.M.) or a tunnel effect microscope (S.T.M.).

This close field microscope is used to oxidise the silicon surface of the layer 3 initially uniform and previously hydrogenated. This hydrogenated surface is then etched chemically, for example by a chemical anisotropic attack of the surface in NaOH or KOH where silica is little soluble. The patterns requested are formed thus.

Controlling nano-oxidation of the surface of the silicon layer by an A.F.M. tip can be realised advantageously by using voltage pulses that are applied to the tip.

The A.F.M. tip is used in a non-contact mode, i.e. the cantilever that carries the tip is subject to periodic oscillations with frequency f in the order of a few hundreds kHz, for example 300 kHz.

A voltage is applied on this tip establishing a potential difference between the active layer 3 and the tip of the order of ten volts, at a frequency equal to that of the oscillations of the cantilever. The pulses are synchronised with respect to the oscillations of the lever. Oxidation is controlled, more accurately the width of the oxidised zone, by acting on the phase difference between the voltage pulses and the oscillations of the cantilever. It is thus possible to trace the zones intended to form the bridges and those intended to form the islands.

The polarisation electrodes are thus realised according to well-known and conventional techniques linked with the technology of electronic components.

It is thus possible to manufacture a semiconductor infrared detector by using the mastered techniques of the silicon technology, which enables obtaining very good compatibility with integrated circuits. Moreover, placing in parallel several detectors enables improving the sensitivity of the systems obtained in that manner.

What is claimed is:

1. A semiconductor infrared detector structured and arranged so that infringing infrared photons cause electric carriers to pass from a ground state in which the electric carriers are bound, to an excited state, thereby creating an electron-hole pair for generating a current in the detector, said detector comprising in order:

a semiconductor substrate;

an insulating material;

a semiconductor material having patterns formed therein, wherein said patterns include at least one island connected to a plurality of bridges, said plural bridges being connected between polarization electrodes, wherein the plural bridges are lines with an approximately constant width, $l_p$, and wherein the islands are zones with a width $l_i$ larger than $l_p$, said zones being arranged with infrared photons and electric carriers so that when the infrared photons are excited, the infrared photons cause the electric carriers to pass from a ground state in which the electric carriers are bound, to an excited state, thereby creating an electron-hole pair for generating a current in the detector.

2. The semiconductor infrared detector as claimed in claim 1, wherein said lines number between 1 and 1000, and wherein each of said patterns comprises between approximately 1 and 100 islands.

3. The semiconductor infrared detector according to claim 1, wherein $l_p$ is between 1 and 10 nm.

4. The semiconductor infrared detector according to claim 3, wherein $l_i \geq 1.2\, l_p$.

5. The semiconductor infrared detector according to claim 3, wherein L a length of the at least one island satisfies the relation $2\, l_p \leq L \leq 5\, l_p$.

* * * * *